United States Patent [19]

Kimura et al.

[11] 4,063,270
[45] Dec. 13, 1977

[54] SEMICONDUCTOR CONTROLLED RECTIFIER DEVICE HAVING AMPLIFYING GATE STRUCTURE

[75] Inventors: Shin Kimura, Hitachi; Yoshio Terasawa, Katsuta, both of Japan

[73] Assignee: Hitachi, Ltd., Japan

[21] Appl. No.: 687,745

[22] Filed: May 18, 1976

[30] Foreign Application Priority Data

June 4, 1975   Japan ................................. 50-66466

[51] Int. Cl.² ........................................... H01L 29/74
[52] U.S. Cl. ...................................... 357/38; 357/20; 357/86
[58] Field of Search .............................. 357/20, 38, 86

[56] References Cited

U.S. PATENT DOCUMENTS

| | | | |
|---|---|---|---|
| 3,579,060 | 5/1971 | Davis | 357/38 |
| 3,586,927 | 6/1971 | Roach et al. | 357/38 |
| 3,897,286 | 7/1975 | De Cecco et al. | 357/38 |

FOREIGN PATENT DOCUMENTS

| | | | |
|---|---|---|---|
| 2,210,386 | 9/1973 | Germany | 357/38 |
| 2,346,256 | 3/1975 | Germany | 357/38 |

Primary Examiner—Stanley D. Miller, Jr.
Assistant Examiner—Joseph E. Clawson, Jr.
Attorney, Agent, or Firm—Craig & Antonelli

[57] ABSTRACT

A semiconductor controlled rectifier device comprises a semiconductor substrate consisting of a plurality of layers of alternately different conductivity types, in which the outermost layer exposed at one of the principal surfaces is divided into a first portion providing a main thyristor, and a second portion having an area smaller than that of the first portion and providing an auxiliary thyristor. In the device, the second portion of the outermost layer of the substrate comprises a first region participating in the turn-on of the device, and a second region acting to increase the minimum gate current necessary to turn on the device, thereby increasing the minimum gate current necessary to turn on the auxiliary thyristor without appreciably increasing the gate current required for turning on the auxiliary thyristor and without reducing the switching power capability of the device, so that mal-firing due to noise current induced between the gate and the cathode can be prevented.

11 Claims, 15 Drawing Figures

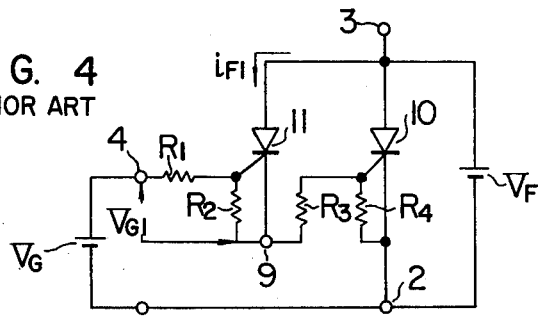
FIG. 4
PRIOR ART
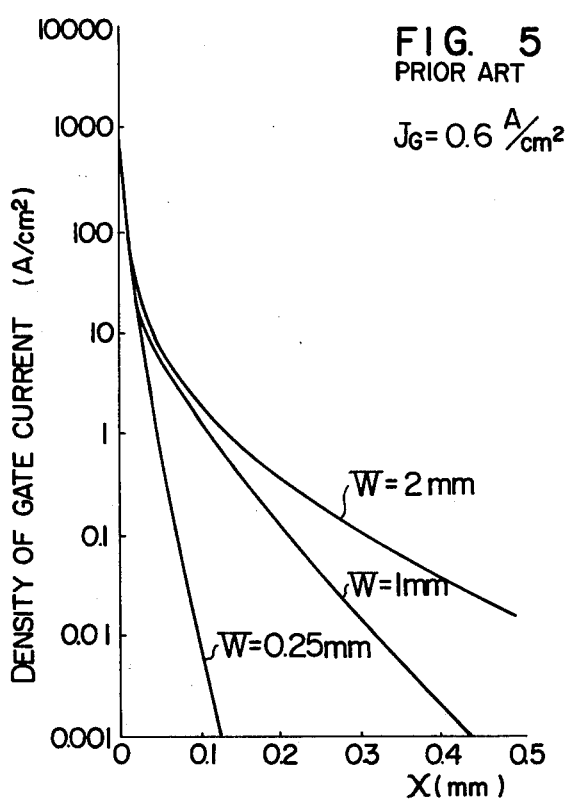
FIG. 5
PRIOR ART
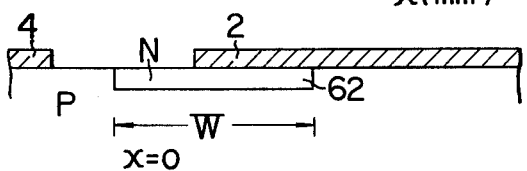

SEMICONDUCTOR CONTROLLED RECTIFIER DEVICE HAVING AMPLIFYING GATE STRUCTURE

FIELD OF THE INVENTION

This invention relates to a semiconductor controlled rectifier device employing an amplifying gate structure.

BRIEF DESCRIPTION OF THE DRAWINGS

FIG. 4 is an equivalent circuit diagram for illustrating the turn-on mechanism of the amplifying gate type thyristor shown in FIGS. 1 and 2.

FIG. 5 is a graph showing the density distribution of gate current flowing into the second portion of the N-emitter layer of the amplifying gate type thyristor shown in FIGS. 1 and 2.

DESCRIPTION OF THE PRIOR ART

An amplifying gate structure is employed in thyristors designed to operate with a high applied voltage across the device and large current or at a high speed. This amplifying gate structure is proposed in various gate forms called an FI gate (Field Initiated gate), an amplifying gate and a regenerative gate. The FI gate is disclosed in, for example, U.S. Pat. No. 3,408,545 and German laid-open specification (DOS) No. 1,489,931; the amplifying gate is disclosed in, for example, U.S. Pat. No. 3,526,815; and the regenerative gate is disclosed in, for example, U.S. Pat. No. 3,486,088 and German laid-open specification (DOS) No. 1,906,816.

Figure 1:
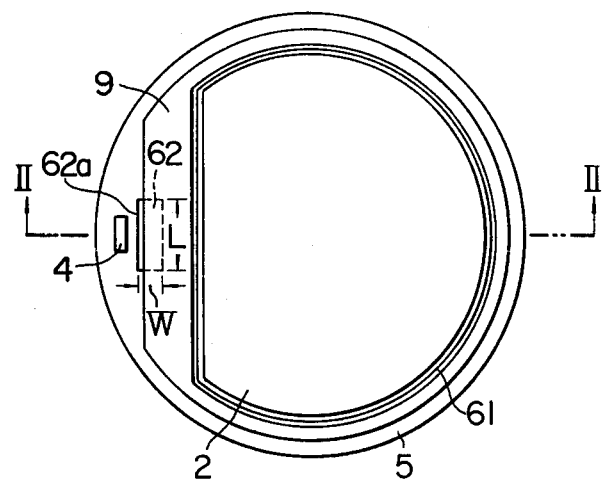
FIG. 1 is a schematic plan view of a prior art amplifying gate type thyristor.
Figure 2:
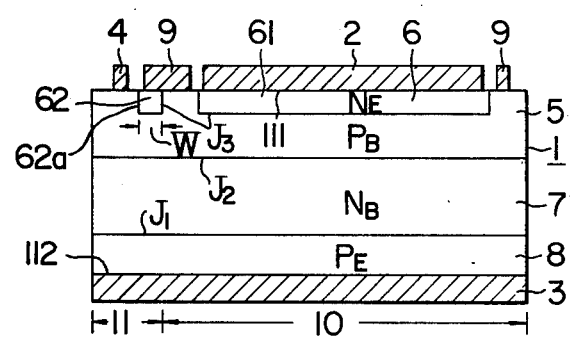
FIG. 2 is a schematic sectional view taken on the line II—II in FIG. 1.

The structure and turn-on mechanism of a prior art amplifying gate type thyristor will be described with reference to FIGS. 1 to 4. A thyristor employing the gate form called the amplifying gate has a structure as, for example, shown in FIGS. 1 and 2. Referring to FIGS. 1 and 2, a semiconductor substrate designated generally by the reference numeral 1 comprises an N-emitter layer 6, a P-base layer 5, an N-base layer 7 and a P-emitter layer 8 formed contiguously between a pair of opposite principal surfaces 111 and 112. The N-emitter layer 6 is formed within the P-base layer 5 with the surface thereof exposed at the principal surface 111 of the substrate 1 and comprises a first portion 61 and a second portion 62 having a smaller surface area than that of the first portion 61. The first portion 61 of the N-emitter layer 6 provides one of the end layers of a first four-layer region acting as a main thyristor 10, while the second portion 62 of the N-emitter layer 6 provides one of the end layers of a second four-layer region acting as an auxiliary thyristor 11. The first and second portions 61 and 62 of the N-emitter layer 6 are isolated from each other in the case of the gate form called the amplifying gate, but they are connected to each other in the gate forms called the FI gate and regenerative gate.

Figure 3:
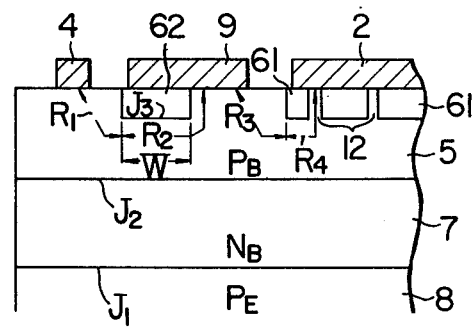
FIG. 3 is an enlarged view of part of FIG. 2.

An electrode 2 is in ohmic contact with the surface of the first portion 61 of the N-emitter layer 6 to provide the cathode, and another electrode 3 is in ohmic contact with the surface of the P-emitter layer 8 to provide the anode. Another electrode 4 is in ohmic contact with the surface of the P-base layer 5 adjacent to the second portion 62 of the N-emitter layer 6 to provide the gate electrode. The second portion 62 has an pn junction 62a between it and the P-base layer 5, opposite to the gate electrode 4. An annular electrode 9 covers by a portion thereof the greater part of the surface of the second portion 62 of the N-emitter layer 6 and surrounds by the remaining portion thereof the first portion 61 of the N-emitter layer 6 with a predetermined spacing therebetween to provide the auxiliary gate electrode. FIG. 3 shows in detail the gate portions of the thyristor shown in FIGS. 1 and 2. As shown in FIG. 3, a short-circuit hole 12 is commonly formed in the first portion 61 of the N-emitter layer 6 so as to increase the $dV/dt$ (the rate of rise of the forward voltage across the device) capability.

The turn-on mechanism of the thyristor having such a structure will be described with reference to an equivalent circuit shown in FIG. 4. Gate current flows from the gate electrode 4 to a resistor $R_2$ through another resistor $R_1$. When the voltage drop across the resistor $R_2$ exceeds the built-in voltage level of a pn junction $J_3$, the gate current is permitted to flow through the junction $J_3$ into the second portion 62 of the N-emitter layer 6 to turn on the auxiliary thyristor 11. The turn-on current $i_{F1}$ (forward current) flowing through the auxiliary thyristor 11 acts as gate current for the main thyristor 10 to turn on the same in a manner similar to the manner of turn-on of the auxiliary thyristor 11.

In the turn-on mechanism of the amplifying gate type thyristor, the minimum gate current $(I_G)$min required for turning on the auxiliary thyristor 11 is given approximately by the following equation:

$$(I_G)_{min} = V_b/R_2 \tag{1}$$

where $V_b$ is the built-in voltage of the pn junction $J_3$ between the N-emitter and the P-base.

In the case in which thyristors of the type above described are used for various purposes, especially in the case in which a plurality of such thyristors are connected in parallel in a circuit, these thyristors must have a uniform turn-on characteristic in order to avoid an unbalance of current through the device. The desired thyristor combination can be easily obtained and the yield rate of the thyristors can be improved when the thyristors can be manufactured to possess a uniform turn-on characteristic. When the efficiency of carrier injection into the pn junction $J_3$ is improved, the gate sensitivity can be increased to provide a satisfactory turn-on characteristic, with the result that unfavorable dispersion of the turn-on characteristics of the individual thyristors can also be avoided. Further, this is advantageous in that the forward voltage drop across the thyristors can also be made satisfactorily uniform. However, in the case of the prior art thyristor shown in FIGS. 1 and 2, the improvement in the carrier injection efficiency tends to result in a reduction of the minimum gate current required for turning on the thyristor, and an excessive reduction of the minimum gate current may lead to mal-operation of the thyristor such that the thyristor to be turned on by the normal signal may be turned on by noise current or like disturbance. Although such mal-firing of the thyristor can be prevented by incorporating special means in the gate circuit, this is undesirable in that the structure of the gate circuit becomes quite complicated.

The level of the minimum gate current required for turning on the thyristor can be changed by varying the resistance value of the resistor $R_2$ in the equation (1). To this end, the length L (FIG. 1) of the second portion 62 of the N-emitter layer 6 opposite to the gate electrode 4 may be increased, or the width W of the second portion 62 of the N-emitter layer 6 may be decreased to decrease the resistance value of the resistor $R_2$, thereby increasing the level of the minimum gate current required for turning on the thyristor. However, the increase in the length L of the second portion 62 of the N-emitter layer 6 results inevitably in the necessity for increasing the current capacity of the gate circuit, while the decrease in the width W of the second portion 62 of the N-emitter layer 6 results inevitably in the reduction of the switching power capability (di/dt capability). The reasons therefor will be described in detail with reference to FIG. 5.

FIG. 5 is a graph showing the results of a test conducted on various thyristors having different widths W of the second portion 62 of the N-emitter layer 6. In this test, no voltage was applied across the anode 3 and the cathode 2 of each of the thyristors, and the density distribution of gate current flowing into the second portion 62 of the N-emitter layer 6 in such a case was measured for each thyristor. The vertical axis of this graph represents the gate current density, and the horizontal axis represents the distance measured in the direction of the width W from the end (i.e., the junction 62a) of the second portion 62 of the N-emitter layer 6 nearest to the gate electrode 4. The gate current density is maximum at the end of the second portion 62 of the N-emitter layer 6 nearest to the gate electrode 4 and decreases with the shift of the measured position toward the remotest end. The turn-on by the gate current occurs initially in a region of the second portion 62 of the N-emitter layer 6 where the gate current density is higher than a predetermined value. The region of high gate current density is narrowed with the decrease in the width W of the second portion 62 of the N-emitter layer 6 as seen in FIG. 5, with the result that the initial turn-on region is narrowed to reduce the switching power capability of the thyristors.

On the other hand, the minimum gate current required for turning on the device can be increased in proportion to the increase in the length L of the second portion 62 of the N-emitter layer 6 opposite to the gate electrode 4 as described previously, when the width W is kept constant and the length L is increased. However, at the same time, it becomes necessary to greatly increase the gate current required for practically operating the thyristors. (This gate current will be referred to hereinafter as an operation gate current.) More precisely, for the reliable turn-on of a plurality of thyristors at the same time, it is necessary to supply an operation gate current sufficiently greater than the minimum gate current thereby increasing the density of gate current flowing into the second portion 62 of the N-emitter layer 6 in each thyristor, in order that the individual thyristors as well as the regions of the auxiliary thyristors can be turned on with least fluctuation of the turn-on delay time. When, for example, a plurality of thyristors with the minimum gate current setting of 20 to 30 mA are connected in series and in parallel, an operation gate current of about 1 ampere is generally supplied in order to turn-on the individual thyristors with least fluctuation of the turn-on delay time. The minimum turn-on gate current setting of 40 to 60 mA which is twice the value above described can be provided by increasing the length L to twice the previous value. In such a case, however, it is necessary to supply an operation gate current of 2 amperes to cause flow of the gate current of the same density into the second portion 62 of the N-emitter layer 6 of the individual thyristors, in order that the individual thyristors can be turned on with the substantially same turn-on delay time. Consequently, the value of the operation gate current must be increased by 1 ampere in order to increase the minimum turn-on gate current setting by 20 to 30 mA. This is undesirable in that the current capacity of the gate circuit must be increased correspondingly.

SUMMARY OF THE INVENTION

It is a primary object of the present invention to provide a semiconductor controlled rectifier device having an amplifying gate structure in which the minimum gate current can be increased without increasing the level of the operation gate current required for the turn-on and without reducing the switching power capability.

A preferred embodiment of the present invention, which is applied to the prior art amplifying gate type thyristor, is featured by the fact that the second portion 62 of the N-emitter layer 6 defining an pn junction 62a between it and the P-base layer 5 opposite to the gate electrode 4 comprises a first region starting from the junction 62a to extend away from the gate electrode 4 with a predetermined effective width, and at least one second region starting from the junction 62a to extend away from the gate electrode 4 with an effective width shorter than the predetermined effective width.

In the semiconductor controlled rectifier device according to the present invention, the minimum gate current can be increased by the amount corresponding to the gate current flowing through a bypass route formed in the P-base layer portion underlying the second region having the shorter effective width, thereby preventing mal-firing by noise current induced between the gate electrode and the cathode. This bypass effect is reliably maintained and is not affected by processing such as surface etching in the course of manufacture of the thyristor. Further, the first region having the predetermined effective width turns on faster than the second region, and therefore, no reduction occurs in the switching power capability of the device. Further, the operating gate current required for turning on the device need not be appreciably increased.

DESCRIPTION OF THE PREFERRED EMBODIMENTS

Figure 6:
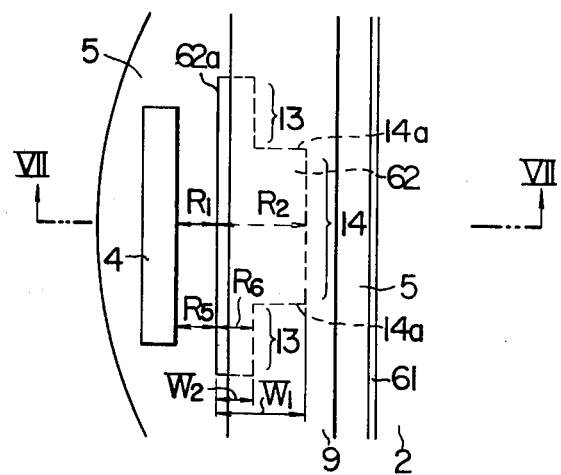
FIG. 6 is a schematic plan view of a first preferred embodiment of the present invention showing an application of the present invention to the prior art amplifying gate type thyristor shown in FIGS. 1 and 2.
Figure 7:
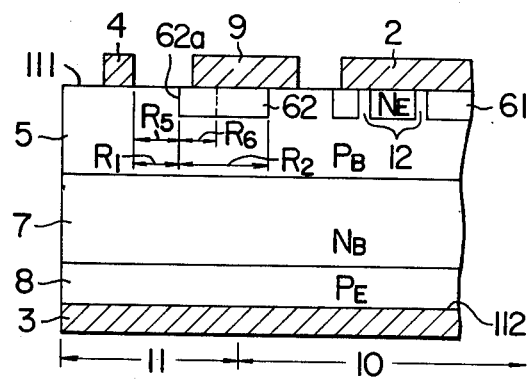
FIG. 7 is a schematic sectional view taken on the line VII—VII in FIG. 6.

A preferred embodiment of the present invention will be described with reference to FIGS. 6 and 7. FIG. 6 is a schematic partial plan view showing an application of the present invention to the prior art amplifying gate type thyristor shown in FIGS. 1 and 2, and FIG. 7 is a schematic sectional view taken on the line VII—VII in FIG. 6. Like reference numerals and symbols are used in FIG. 6 and FIG. 7 to denote like parts appearing in FIGS. 1 and 2. Thus, the reference numerals 2, 3, 4, 5, 6, 7, 8 and 9 designate a cathode, an anode, a gate electrode, a P-base layer, an N-emitter layer, a P-emitter layer, and an auxiliary gate electrode, respectively.

The reference numeral 61 designates similarly a first portion of the N-emitter layer 6 providing the end layer of a main thyristor 10, and this first portion 61 will be referred to hereinafter as a main N-emitter layer. A short-circuit hole 12 is similarly provided in this main N-emitter layer 61 to increase the $dV/dt$ capability. The reference numeral 62 designates similarly a second portion of the N-emitter layer 6 providing the end layer of an auxiliary thyristor 11, and this second portion 62 will be referred to hereinafter as an auxiliary N-emitter layer. This auxiliary N-emitter layer 62 defines an pn junction 62a between it and the P-base layer 5, and this junction 62a is exposed at one end thereof at one principal surface 111 of the semiconductor substrate, which junction 62a is opposite to the gate electrode 4. As is shown in FIG. 6, the exposed end of the junction 62a is substantially in parallel with an edge portion of the contact area between the gate electrode 4 and the N-emitter layer 5. The auxiliary N-emitter layer 62 comprises a first region 14 starting from the junction 62a to extend away from the gate electrode 4 with a predetermined effective width $W_1$, and second regions 13 starting from the junction 62a to extend away from the gate electrode 4 with an effective width $W_2$ shorter than the width $W_1$. By the provision of the second regions 13 of shorter width $W_2$, resistors $R_5$ and $R_6$ are formed by the corresponding portions of the P-base layer 5. These resistors $R_5$ and $R_6$ are connected between the gate electrode 4 and the auxiliary gate electrode 9 in the equivalent circuit shown in FIG. 4.

The turn-on mechanism of the embodiment of the present invention shown in FIGS. 6 and 7 does not differ basically from that of the prior art amplifying gate type thyristor described with reference to FIGS. 1 to 4. However, the thyristor according to the present invention is advantageous over the prior art thyristor in that the minimum gate current $(I_G)'$min is increased by the amount corresponding to the current flowing through the bypass route provided by the resistors $R_5$ and $R_6$ formed due to the provision of the second regions 13. From the equation (1), the minimum gate current $(I_G)$min for the auxiliary thyristor 11 including the first region 14 is given by $(I_G)$min = $V_b/R_2$, and in this case, the gate voltage $V_{G1}$ across the gate electrode 4 and auxiliary gate electrode 9 is given by $V_{G1} = (I_G)$min · $(R_1 + R_2)$. The gate current flowing through the resistors $R_5$ and $R_6$ formed by the provision of the second regions 13 is given by $(V_{G1}/R_5 + R_6)$ since these resistors $R_5$ and $R_6$ are connected between the gate electrode 4 and the auxiliary gate electrode 9.

Therefore, the minimum gate current $(I_G)'_{min}$ for the thyristor according to the present invention is represented by the sum of the minimum gate current $(I_G)_{min}$ for the auxiliary thyristor 11 including the first region 14 and the gate current $(V_{G1}/R_5 + R_6)$ flowing through the bypass route formed by the provision of the second regions 13. Thus, $(I_G)'_{min}$ is expressed as $$(I_G)'_{min} = (I_G)_{min} + (V_{G1}/R_5 + R_6) = (I_G)_{min} + [(I_G)_{min} \cdot (R_1 + R_2)/R_5 + R_6] = (I_G)_{min} \cdot (1 + [R_1 + R_2/R_5 + R_6]) \quad (2)$$

It will thus be seen that the minimum gate current $(I_G)'_{min}$ for the thyristor according to the present invention is greater by the amount corresponding to $(I_G)_{min} \cdot (R_1 + R_2/R_5 + R_6)$ than the minimum gate current $(I_G)_{min}$ for the prior art thyristor. The minimum gate current $(I_G)'_{min}$ for the thyristor of the present invention can be changed by varying the resistance values of the resistors $R_1$, $R_5$ and $R_6$. (The resistance value of the resistor $R_2$ is determined depending on the switching characteristic as described previously.)

In the present invention, the portion of the P-base layer 5 underlying the auxiliary N-emitter layer 62 is used as the resistor $R_6$ to provide the bypass route for the gate current together with the resistor $R_5$. It may be considered convenient that the exposed portion of the P-base layer 5 corresponding to the resistor $R_5$ is merely used to provide the gate-current bypass route between the gate electrode 4 and the auxiliary gate electrode 9. However, this is undesirable in that the surface etching applied to the P-base layer 5, having a high impurity concentration and a low resistivity, in the course of manufacture of the thyristor tends to give rise to a great variation in the resistance value of the bypass region, resulting in a great fluctuation of the minimum gate current. In the thyristor according to the present invention, the portion of the P-base layer 5 underlying the second regions 13 is used as the resistor $R_6$ to provide the bypass route together with the resistor $R_5$. Therefore, the minimum gate current is uniform in all the thyristors due to the fact that no variation occurs in the resistance value of the resistor $R_6$ in spite of the surface etching applied to the P-base layer 5 in the course of manufacture of the thyristors.

The relation between the gate current flowing into the second regions 13 and that into the first region 14 in the thyristor of the present invention will now be described. When the gate current flows through the portion of the P-base layer 5 underlying the first region 14 and the voltage drop thereacross exceeds the built-in voltage level $V_b$ of the pn junction $J_3$, the resistance of the pn junction $J_3$ is decreased to such an extent that it is negligible compared with that of the resistor $R_2$, and concentrated gate current flows now into the first region 14 of the auxiliary N-emitter layer 62. The resistance of the resistor $R_6$ is preferably determined at such a value that the voltage drop across the resistor $R_6$ due to the flow of gate current through the portion of the P-base layer 5 underlying the second regions 13 does not exceed the built-in voltage level $V_b$ of the junction $J_3$ even when gate current required for turning on the auxiliary thyristor 11 flows into the first region 14.

When the resistance value of the resistor $R_6$ is so determined, any appreciable gate current does not flow into the second regions 13, that is, the value of gate current to flow through the bypass provided by the second regions 13 is small. An operation gate current of, for example, 1 ampere has been required for turning on a thyristor having a minimum gate current setting of 20 mA as described previously. It has been necessary to increase the length L of the auxiliary N-emitter layer 62 opposite to the gate electrode 4 to twice the original value in order to increase the minimum gate current setting of this thyristor to 40 mA which is twice the original setting, and this has resulted in the necessity for supplying an operation gate current of 2 amperes. According to the present invention, the minimum gate current setting can be easily increased from 20 mA to 40 mA due to the fact that gate current of very small value or about 50 mA flows into the second regions 13 when the operation gate current of 1 ampere flows into the first region 14 functioning as the end layer of the auxiliary thyristor 11. Therefore, the operation gate current of about 1.05 amperes is merely required for turning on the thyristor of the present invention.

It will be understood from the foregoing description of the first preferred embodiment of the present invention that the minimum gate current setting can be increased without appreciably increasing the operation gate current required for turning on the auxiliary thyristor 11, and mal-firing due to noise current induced between the gate electrode and the cathode can be reliably prevented.

Figure 8:
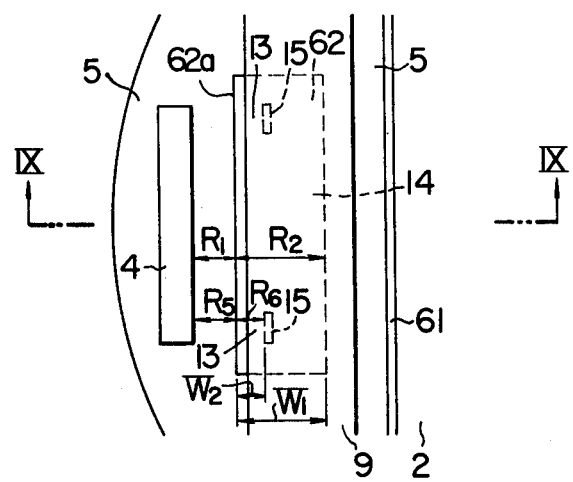
FIG. 8 is a schematic plan view of a second preferred embodiment of the present invention showing an application of the present invention to the prior art amplifying gate type thyristor.
Figure 9:
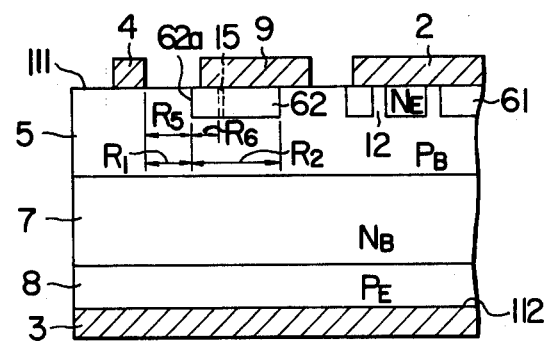
FIG. 9 is a schematic sectional view taken on the line IX—IX in FIG. 8.

FIGS. 8 and 9 show a second preferred embodiment of the present invention as applied to the prior art amplifying gate type thyristor. In FIGS. 8 and 9, the same reference numerals and symbols are used to denote the same parts appearing in FIGS. 6 and 7.

In the second embodiment of the present invention, the auxiliary N-emitter layer 62 comprises a single region starting from the junction 62a to extend away from the gate electrode 4 with a predetermined effective width $W_1$. A pair of spaced rectangular holes 15 are formed in this auxiliary N-emitter layer 62 for permitting extention thereinto of corresponding portions of the P-base layer 5 so that these extentions of the P-base layer 5 can be exposed at the principal surface 111 of the semiconductor substrate. Thus, additional pn junctions are formed between these portions of the P-base layer 5 and the associated portions of the auxiliary N-emitter layer 62.

In the thyristor having such a structure, the greater part of gate current supplied from the gate electrode 4 toward the holes 15 flows into the auxiliary gate electrode 9 through the holes 15, and thus, this structure provides the merit similar to that exhibited by the provision of the regions 13 of shorter effective width shown in FIGS. 6 and 7. It will be seen that the regions defined substantially between the junction 62a and the additional junctions taking into account the flow of gate current correspond to the regions 13 of shorter effective width shown in FIGS. 6 and 7, and the distance between the junction 62a and the additional junctions corresponds to the shorter effective width $W_2$ in FIGS. 6 and 7. It will be readily understood that the region extending with the effective width $W_1$ without being substantially rendered discontinuous by the additional junctions corresponds to the region 14 shown in FIGS. 6 and 7.

In the embodiment shown in FIGS. 6 and 7, the region 14 has the ends 14a extending normal to the gate electrode 4, and a part of current flowing in the vicinity of these ends 14a of the region 14 may flow into the auxiliary gate electrode 9 without passing through the region 14. In the embodiment shown in FIGS. 8 and 9, the region 14 has no such ends. Thus, gate current flows through the region 14 with a uniform density distribution to ensure satisfactory turn-on of the thyristor.

Figure 10:
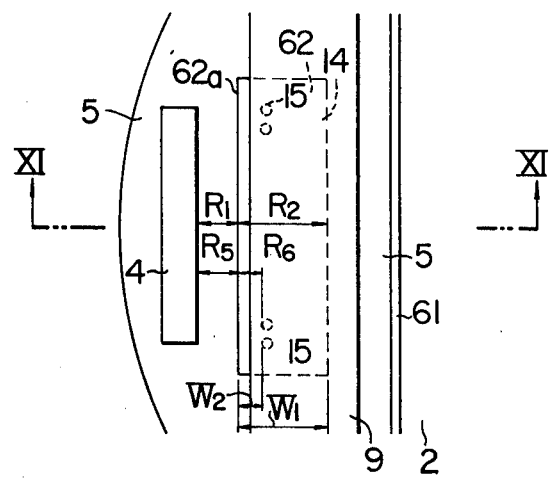
FIG. 10 is a schematic plan view of a third preferred embodiment of the present invention showing an application of the present invention to the prior art amplifying gate type thyristor.
Figure 11:
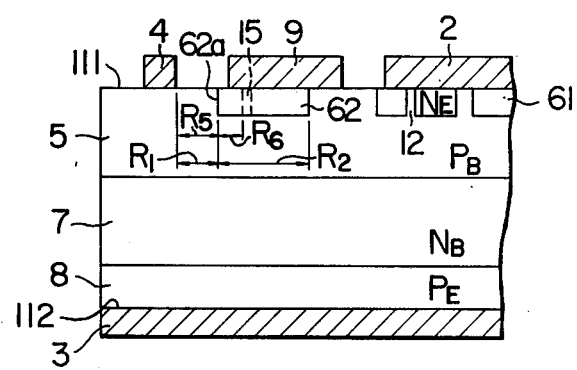
FIG. 11 is a schematic sectional view taken on the line XI—XI in FIG. 10.

FIGS. 10 and 11 show a third preferred embodiment of the present invention in which the rectangular holes 15 shown in FIGS. 8 and 9 are each replaced by a pair of circular ones. It is apparent that the embodiment shown in FIGS. 10 and 11 exhibits the same merit as the embodiment shown in FIGS. 8 and 9.

The foregoing description has referred to an application of the present invention to an amplifying gate type thyristor. Needless to say, the present invention is similarly effectively applicable to a regenerative gate type thyristor.

Figure 12:
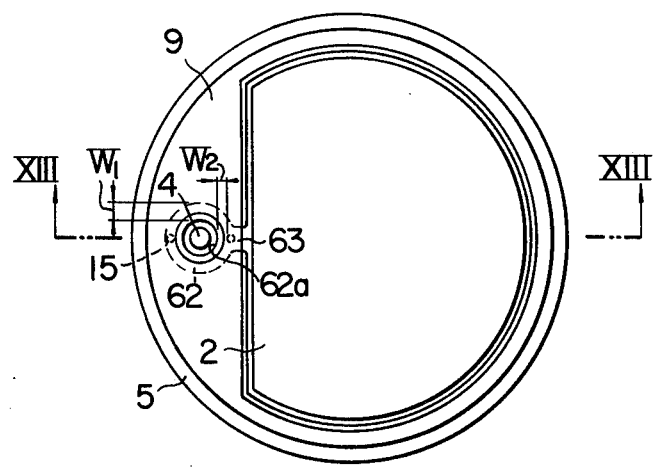
FIG. 12 is a schematic plan view of a fourth preferred embodiment of the present invention showing an application of the present invention to a regenerative gate type thyristor.
Figure 13:
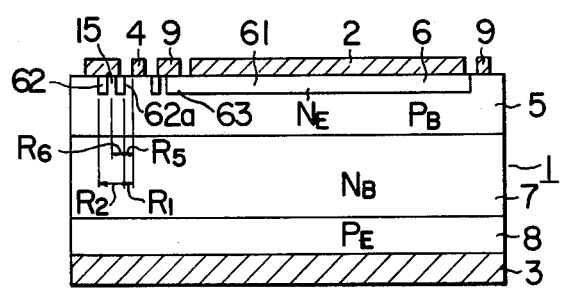
FIG. 13 is a schematic sectional view taken on the line XIII—XIII in FIG. 12.

FIGS. 12 and 13 show another preferred embodiment of the present invention as applied to a regenerative gate type thyristor. In FIGS. 12 and 13, the same reference numerals and symbols are used to designate the same parts appearing in FIGS. 6 to 11. In this regenerative gate type thyristor, an additional layer 63 is formed in the N-emitter layer 6 to provide an integral connection between the main N-emitter layer 61 and the auxiliary N-emitter layer 62. This integral connection of the auxiliary N-emitter layer 62 with the main N-emitter layer 61 by the additional layer 63 increases the $dV/dt$ capability of the thyristor. In the present embodiment, a pair of spaced circular holes 15 are formed in the auxiliary N-emitter layer 62 extending to surround concentrically the gate electrode 4 of circular cross section, which forms the junction 62a substantially in parallel with the edge portion of the contact area between the gate electrode 4 and the N-emitter layer 5, and corresponding portions of the P-base layer 5 extend into these holes 15. Additional PN junctions are formed within the auxiliary N-emitter layer 62 by the provision of the holes 15 to provide respective regions having effective widths $W_1$ and $W_2$ as described hereinbefore. It will therefore be understood that the embodiment shown in FIGS. 12 and 13 exhibits the same merit as the embodiments shown in FIGS. 8, 9 and FIGS. 10, 11.

Figure 14:
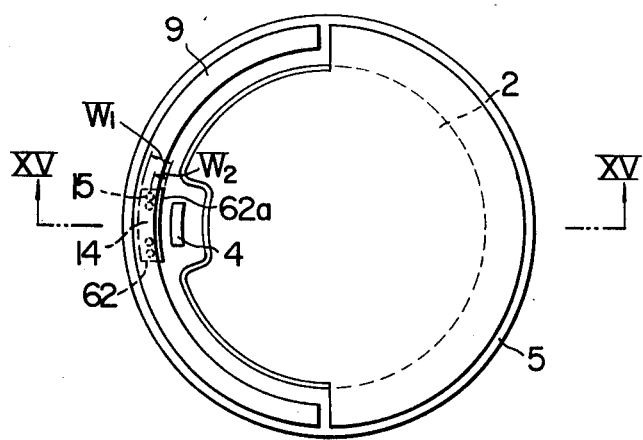
FIG. 14 is a schematic plan view of a fifth preferred embodiment of the present invention showing an application of the present invention to another prior art amplifying gate type thyristor.
Figure 15:
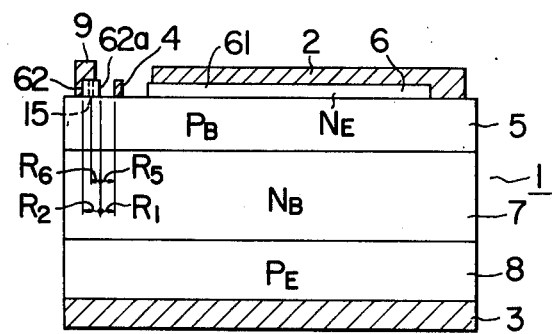
FIG. 15 is a schematic sectional view taken on the line XV—XV in FIG. 14.

FIGS. 14 and 15 show another preferred embodiment of the present invention as applied to an amplifying gate type thyristor of construction in which the gate electrode 4 is formed between the auxiliary N-emitter layer 62 and the main N-emitter layer 61, and the corresponding surface portion of the P-base layer 5 is etched down. In FIGS. 14 and 15, the same reference numerals and symbols are used to denote the same parts as those in the embodiments described hereinbefore. The present embodiment is similar to the embodiment shown in FIGS. 10 and 11 in that holes 15 are provided in the auxiliary N-emitter layer 62 to form additional PN junctions therein. The merit of the embodiment of the present invention shown in FIGS. 14 and 15 remains still effective even when the position of the gate electrode 4 or the amount of surface etch-down for the P-base layer 5 is changed.

Although the embodiments shown in FIGS. 8 to 15 are illustrated to include a plurality of holes 15 for forming the additional junctions, the number of such holes may be selected as desired, and a single hole may merely be provided. The holes or hole may be disposed at any suitable position provided that the resistor $R_6$ of desired resistance value and the regions 13 and 14 can be defined by the provision of the holes or hole.

We claim:

1. A semiconductor controlled rectifier device comprising a semiconductor substrate consisting of a plurality of layers of alternately different conductivity types and having a first and a second principle surface opposite to each other, the first layer exposed at said first principal surface of said semiconductor substrate being divided into a first portion and a second portion having an area smaller than that of said first portion, and the second layer continuous to the first layer having a portion thereof exposed at said first principal surface, a first main electrode disposed on said first principal surface and making ohmic contact with said first portion of said first layer, a gate electrode disposed on said first principal surface adjacent to said second portion of said first layer and making ohmic contact with the second layer, said gate electrode having a contact area with the second layer with an edge of substantial length, an auxiliary gate electrode disposed on said first principal surface adjacent to at least a part of said first portion and making ohmic contact with said second layer and at least a part of said second portion of said first layer, and a second main electrode disposed at a predetermined position on a selected one of said first and second principal surfaces, said second portion of said first layer defining between it and said second layer a junction adjacent to said gate electrode with an end exposed at said first principal surface, said exposed end extending substantially in parallel with said edge of the contact area, wherein said second portion of said first layer comprises a first region extending away from said gate electrode to have a predetermined effective width measured from said junction, and a second region extending away from said gate electrode contiguous to said first region to have an effective width smaller than said predetermined effective width measured from said junction.

2. A semiconductor controlled rectifier device as claimed in claim 1, wherein said first region extends from said junction away from said gate electrode over the distance corresponding to said predetermined effective width, said second region extends from said junction away from said gate electrode over the distance corresponding to said shorter effective width.

3. A semiconductor controlled rectifier device as claimed in claim 2, wherein said second region is disposed on each side of said first region to lie in parallel with said junction.

4. A semiconductor controlled rectifier device as claimed in claim 1, wherein said second portion of said first layer extends from said junction away from said gate electrode over the distance corresponding to said predetermined effective width and includes at least one additional junction defined between said second portion of said first layer and said second layer with an end exposed at said first principal surface and formed at the position spaced apart from said junction by the distance corresponding to said shorter effective width, said first region is a partial region of said second portion of said first layer extending without being substantially rendered discontinuous by said additional junction, and said second region is another partial region of said second portion of said first layer defined substantially between said junction and said additional junction.

5. A semiconductor controlled rectifier device as claimed in claim 4, wherein said additional junction is formed in such a configuration that said exposed end thereof is in the form of a rectangle having a side extending in parallel with said junction.

6. A semiconductor controlled rectifier device as claimed in claim 5, wherein a pair of said additional junctions are provided by forming a pair of said rectangles which align with each other in a direction parallel with said junction and are spaced apart from each other by a predetermined distance.

7. A semiconductor controlled rectifier device as claimed in claim 4, wherein said additional junction is formed in such a configuration that said exposed end thereof is in the form of a circle.

8. A semiconductor controlled rectifier device as claimed in claim 7, wherein a plurality of said additional junctions are provided by forming a plurality of said circles which align with one another in a direction parallel with said junction and are spaced apart from each other by a predetermined distance.

9. A semiconductor controlled rectifier device as claimed in claim 8, wherein said additional junctions are formed by two pairs of said circles disposed in such a relation that said circles in each pair are spaced apart from each other by a short distance, and said circle pairs are spaced apart from each other by a predetermined distance greater than the distance between said circles in each pair.

10. A semiconductor controlled rectifier device as claimed in claim 7, wherein said gate electrode is circular in cross section when cut along a plane parallel with said first principal surface, said junction is formed in such a configuration that said exposed end thereof is in the form of a circle substantially concentric with said gate electrode of circular cross section, and said additional junction is formed in such a configuration that said exposed end thereof in the form of said circle is disposed on a circle concentric with said gate electrode of circular cross section.

11. A semiconductor controlled rectifier device comprising a semiconductor substrate consisting of a plurality of layers of alternately different conductivity types and having a first and a second principal surface opposite to each other, the first layer exposed at said first principal surface of said semiconductor substrate being divided into a first portion and a second portion having an area smaller than that of said first portion, and the second layer continuous to the first layer having a portion thereof exposed at said first principal surface, a first main electrode disposed on said first principal surface and making ohmic contact with said first portion of said first layer, a gate electrode disposed on said first principal surface adjacent to and spaced apart from said second portion of said first layer and making ohmic contact with the second layer, said gate electrode having a contact area with the second layer with an edge of substantial length, an auxiliary gate electrode disposed on said first principal surface adjacent to at least a part of said first portion and making ohmic contact with said second layer and at least a part of said second portion of said first layer, and a second main electrode disposed at a predetermined position on a selected one of said first and second principal surfaces, said second portion of said first layer defining between it and said second layer a PN junction adjacent to said gate electrode with an end portion thereof exposed at said first principal surface, the entirety of said exposed end portion of said PN junction extending substantially in parallel with the entirety of said edge of the contact area of said gate electrode with said second layer and being separated from said edge of said contact area by the semiconductor material of said second layer exclusively, wherein said second portion of said first layer comprises a first region extending away from said gate electrode to have a predetermined effective width measured from said junction, and a second region extending away from said gate electrode contiguous to said first region to have an effective width smaller than said predetermined effective width measured from said junction.

* * * * *